(12) United States Patent
Park

(10) Patent No.: US 6,441,478 B2
(45) Date of Patent: Aug. 27, 2002

(54) SEMICONDUCTOR PACKAGE HAVING METAL-PATTERN BONDING AND METHOD OF FABRICATING THE SAME

(75) Inventor: Kye Chan Park, Kyoungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 09/858,408

(22) Filed: May 16, 2001

(30) Foreign Application Priority Data

Jul. 24, 2000 (KR) .............................. 00-42377

(51) Int. Cl.[7] .............................. H01L 23/04
(52) U.S. Cl. .................. 257/698; 257/687; 257/690; 257/710; 438/118
(58) Field of Search .................. 257/698, 697, 257/687, 690, 710; 438/118

(56) References Cited

U.S. PATENT DOCUMENTS

| | | | |
|---|---|---|---|
| 4,999,699 A | | 3/1991 | Christie et al. |
| 5,920,118 A | | 7/1999 | Kong ............ 257/684 |
| 6,013,946 A | * | 1/2000 | Lee et al. ............ 257/684 |
| 6,060,340 A | * | 5/2000 | Chou ............ 438/110 |
| 6,091,140 A | | 7/2000 | Toh et al. ............ 257/691 |
| 6,165,816 A | * | 12/2000 | Mizushima et al. ........ 438/118 |

\* cited by examiner

*Primary Examiner*—Hoai Ho
*Assistant Examiner*—Tu-Tu Ho
(74) *Attorney, Agent, or Firm*—Timothy J. Keefer; Wildman, Harrold, Allen & Dixon

(57) ABSTRACT

A semiconductor package including a semiconductor chip having bonding pads respectively arranged in a line adjacent to four sides of the upper surface; gold bumps formed on each bonding pad; a glass substrate which is made by forming metal patterns, the metal pattern including an inner pattern electrically connected to the bonding pad of the semiconductor chip through the gold bumps, an outer pattern, and a connecting pattern between the inner pattern and the outer pattern: a Dam having a frame-shape on the connecting pattern and surrounding the inner patterns; sealing material sealing the space between the glass substrate around the semiconductor chip and solder balls attached on the outer patterns of each metal pattern.

30 Claims, 6 Drawing Sheets

SEMICONDUCTOR PACKAGE HAVING METAL-PATTERN BONDING AND METHOD OF FABRICATING THE SAME

CROSS REFERENCE TO RELATED APPLICATION

This application claims the priority of Korean patent application Serial No. 2000-42377 filed on Jul. 24, 2000.

Semiconductor package and method of fabricating the same

FIELD

The present invention relates to a semiconductor package, and more particularly to a semiconductor package which is minimized and thinned while having reliability and a method of fabricating the same.

BACKGROUND

As is well known, microelectronic devices have a tendency to be minimized and thinned with its functional development and a semiconductor package mounted on a mother board is also following the tendency in order to realize a mounting of high integration.

Most of these semiconductor packages have a structure that the semiconductor chips are sealed with a sealing material such as Epoxy Molding Compound (EMC) and a plurality of leads are fetched/formed outwardly from the sealing material.

However, some devices such as Charge Coupled Device (CCD) have a characteristic that an active area thereof should be open, thereby it is difficult to be sealed with EMC. This is because the contact between the open active area of CCD and the EMC causes the CCD to have a defect.

Therefore, it is suggested a packaging method using a base mold and a cover for packaging the semiconductor chip such as the CCD. A conventional semiconductor package according to the method using the base mold and cover will be described accompanying with FIGS. 1 and 2.

FIG. 1 is a cross-sectional view of a conventional ceramic package using a base mold being consist of ceramic and a cover being consist of glass.

As shown in FIG. 1, a semiconductor chip (5) such as CCD is mounted on a ceramic base mold (1) and the upper part of the ceramic base mold (1) is sealed with a glass (8) in order to prevent the semiconductor chip (5) from being contaminated. The ceramic base mold (1) has a rectangular shape as a whole having a cavity (2) of step i type therein and a plurality of leads (4) are fetched/formed outwardly from a step surface (3) of one side and the other sides. The semiconductor chip (5) is attached on the bottom of a cavity (2) by using an adhesive (6) of an epoxy type. A bonding pad (5a) of the semiconductor chip (5) is electrically connected to one terminal, that is, electrode pad (4a) of the lead (4) by an aluminum or a gold wire (7).

FIG. 2 is a cross-sectional view of a conventional plastic package using EMC and glass. The same codes are used for the same parts as those of FIG. 1.

As shown in FIG. 2, a semiconductor chip (5) is adhered on a die pad (11) of a conventional lead frame (20) composed of a die pad (11), an inner lead (12), and an outer lead (13) by an adhesive (6). The bonding pad (5a) of the semiconductor chip (5) is electrically connected to the inner lead (12) of the lead frame (20) by aluminum or gold wire (7). The lower part of the semiconductor chip (5) and a selected part of the lead frame (20) are molded with EMC in order to prevent the upper part of the semiconductor chip (5) and the inner lead part which is wire-bonded thereto from being covered. The code 21 is a EMC base mold composed of EMC. The upper part of the EMC base mold (21) is sealed with a glass (8) in order to prevent the semiconductor chip (5) from being contaminated.

However, it is difficult to minimize and lighten the above-mentioned packages because of the structural characteristics thereof. And, it is also difficult to be applied to packaging of highly integrated device since there is a limitation on the number of applicable leads.

And, ceramic package is very expensive, thereby difficult to use. Moreover, a micro-gab between EMC and glass, that is, a difference in characteristics between EMC, an organic matter and glass, an inorganic matter degrades a quality and reliability of the plastic package. Contamination of the semiconductor chip due to alpha i particle from the EMC is also a cause to degrade a quality i and reliability.

SUMMARY

Therefore, the present invention was a proposal in order to solve the problem, it is an object of the present invention to provide a semiconductor package which is minimized and thinned while having reliability and the method of fabricating the same.

According to one embodiment of the present invention, a semiconductor chip having bonding pads respectively arranged in a line adjacent to four sides of the upper surface; gold bumps formed on each bonding pad; a glass substrate which is made by forming metal patterns corresponding to the bonding pads on one side, the metal pattern consists of an inner pattern electrically connected to the bonding pad of the semiconductor chip through the gold bump, an outer pattern separated from the inner pattern and connecting pattern between the inner pattern and the outer pattern, and then forming Dam in a frame-shape on the connecting pattern and on the one side to surround the inner patterns; sealing material sealing the space between the glass substrate around the semiconductor chip to the Dam except for the outer pattern of the metal pattern; and solder balls attached on the outer patterns of each metal pattern.

According to another embodiment of the present invention, a method of fabricating a semiconductor package comprises the steps of preparing a semiconductor chip having bonding pads arranged in a line adjacent to four sides of the upper surface and glass substrate which has formed metal patterns consisting of an inner pattern, an outer pattern and a connecting pattern on the position corresponding to the bonding pads; forming gold bumps on each bonding pad; forming a Dam in a frame-shape surrounding the inner patterns on the connecting patterns and the one side of the glass substrate; bonding the semiconductor chip and the glass substrate by using the gold bump to electrically connect the bonding pad and the inner pattern; sealing a space between the glass substrate around the semiconductor chip to the Dam except for the outer pattern; and attaching solder balls on the outer patterns of each metal pattern.

BRIEF DESCRIPTION OF THE DRAWINGS

The above objects, and other features and advantages of the present invention will become more apparent after reading the following detailed description when taken in conjunction with the drawings, in which.

DETAILED DESCRIPTION

Figure 1:
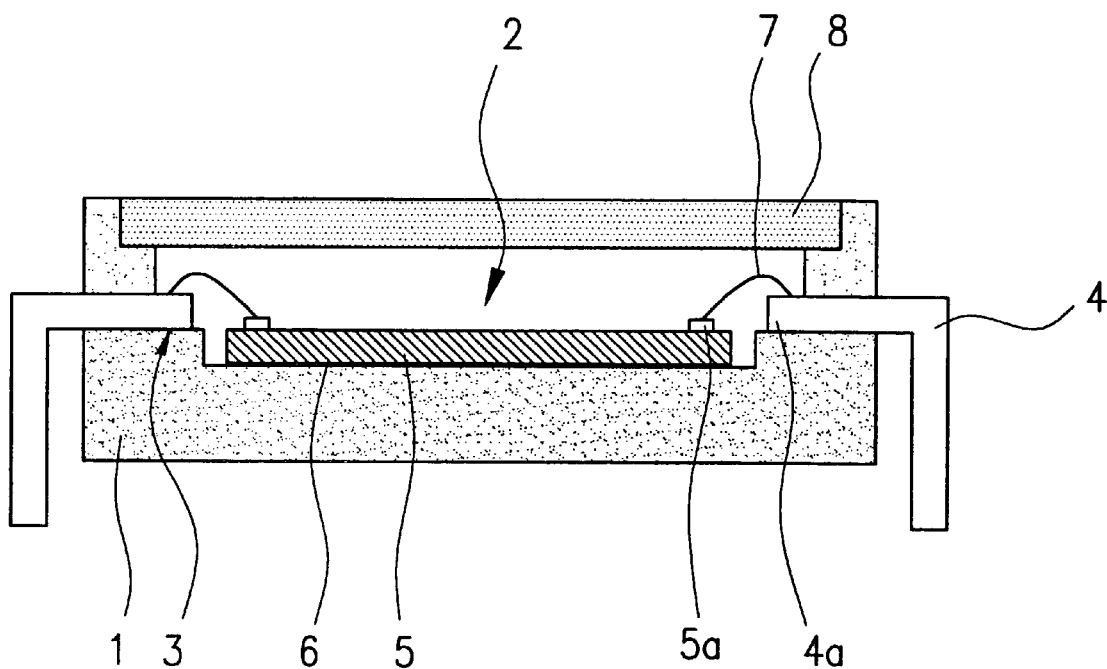
FIG. 1 is a cross-sectional view of a conventional ceramic package.
Figure 2:
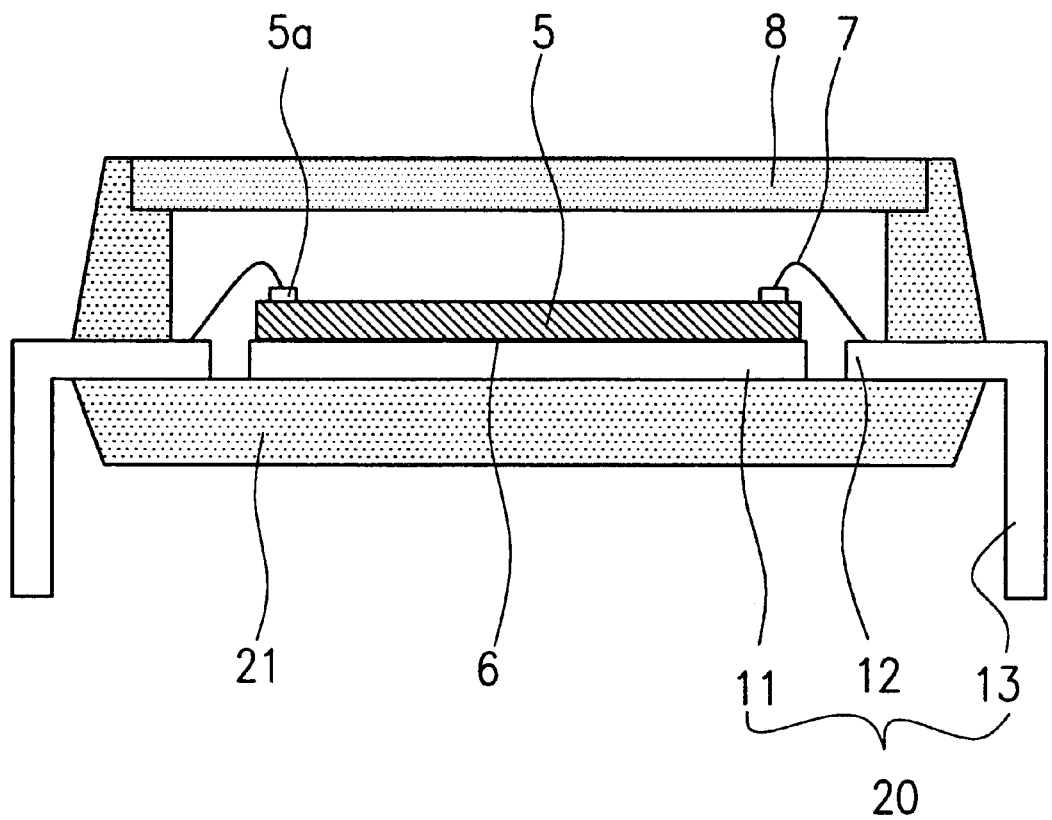
FIG. 2 is a cross-sectional view of a conventional plastic package.
Figure 3:
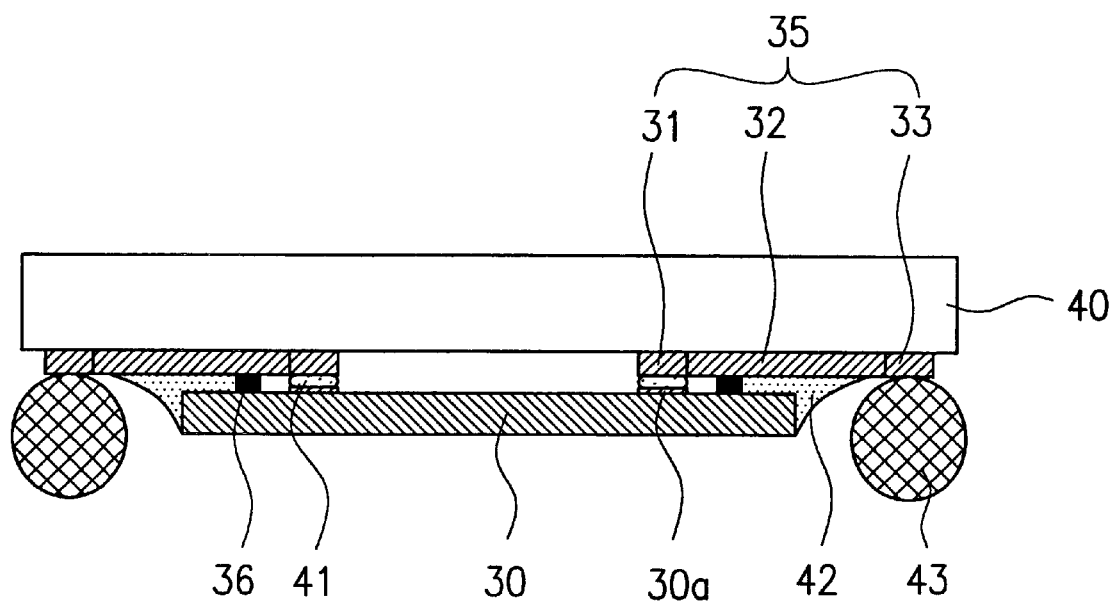
FIG. 3 is a cross-sectional view of a semiconductor package according to the present invention.

FIG. 3 is a cross-sectional view illustrating a semiconductor package according to the embodiments of the present invention.

As illustrated, there are provided a semiconductor chip (30) having bonding pads (30a) and a glass substrate (40) having formed metal patterns (35) thereon corresponding to the bonding pads (30a). Here, the semiconductor chip (30) and the glass substrate (40) are arranged so that the bonding pads (30a) and the metal pattern (35) are put opposite each other. One side (31: hereinafter, referred as inner pattern) of the bonding pad (30a) and the metal pattern is bonded and electrically connected by the gold bump (41) formed on the bonding pad 10 (30a). A solder ball (43) is attached on the other side (33: hereinafter, referred as outer pattern) of the metal pattern, thereby functioning as a mounting means on a mother board. The space between the glass substrate (40) around the semiconductor chip (30) to the Dam (36) except for the outer pattern (33) of the metal pattern (35) is sealed with sealing material (42) composed of epoxy or resin of polymer type.

As the semiconductor chip is CCD, a color filter is formed on an active area of the upper surface thereof. Although it is not shown, the bonding pads (30a) are respectively arranged in a line adjacent to four sides of upper surface of the semiconductor chip (30). The gold bump (41) has a height of 50~175 μm and a diameter of 50~100 μm. The sealing material (42) has a characteristic of curing at a temperature of 70~120° C., such as epoxy or resin of polymer type. A composition rate of tin to lead is 60~80 to 40~20 wt % in the solder ball (43) and silver, gold, chrome or cobalt is used as a dopant to increase reliability. The size of the dopant is about 10 to 40 mil.

Figure 4:
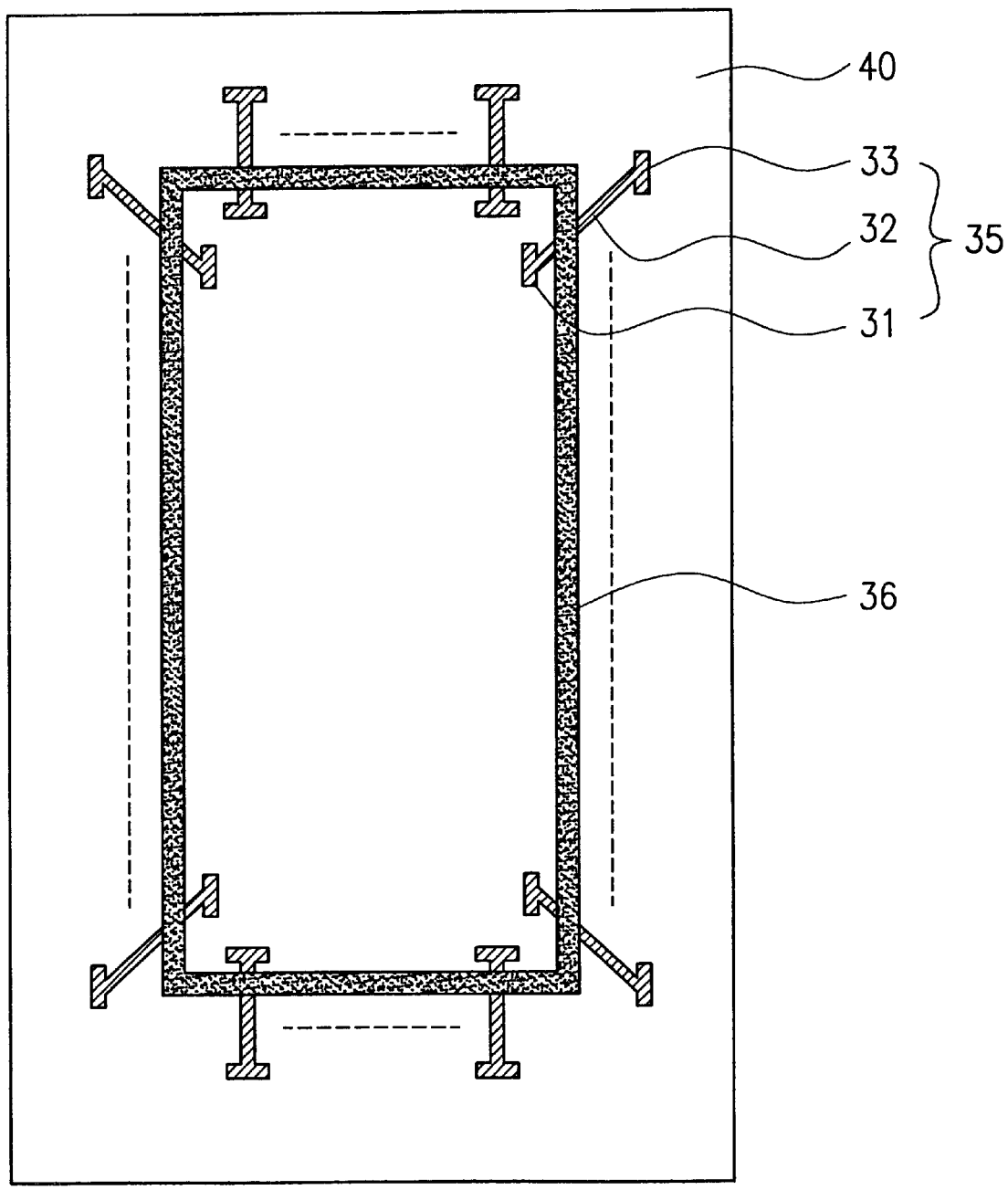
FIG. 4 is a floor plan of a glass substrate according to the present invention.

As shown in FIG. 4, the metal patterns (35) are formed on the position corresponding to each bonding pad of semiconductor chip and have a frame-shape, that is, the Dam (36) surrounds the inner pattern (31) of the metal pattern (35).

The metal pattern (35) comprises an inner pattern (31), an outer pattern (33) and an connecting pattern between them. The metal pattern (35) is made of one compound selected from indium+tin, indium+tin+copper, indium+tin+gold or indium+tin+copper+gold. Alternatively, metals having a similar electric characteristic to these compounds are also used. The metal pattern (35) has a thickness over 1 μm, preferably 1 to 3 μm and a width over 50 μm, preferable 50 to 70 μm. In consideration of a contact with the gold bump (41), the inner pattern (31) has a size over 50 μm×50 μm, preferably 50 μm×50 μm to 100 μm×100 μm. And, in consideration of attachment of the solder ball (43), the outer pattern (33) has a size over 75 μm×75 μm, preferably 75 μm×75 μm to 100 μm×100 μm.

The Dam (36) has a structure that it surrounds the inner patterns (31), that is, a frame-shape and it is formed on the connecting pattern (32) and the glass substrate (40). The Dam (36) is composed of opaque resin having no solvent such as epoxy or polymer resin. And, the width is about 30 to 100 μm and the height is 10 to 70 μm.

The semiconductor package of the above structure has an economical advantage since high-priced ceramic base mold is not used. Moreover, it has reliability since EMC generating alpha particles is not used.

A method of fabricating the semiconductor package according to the present invention will be described referring to FIGS. 5A to 5D.

Figure 5A:
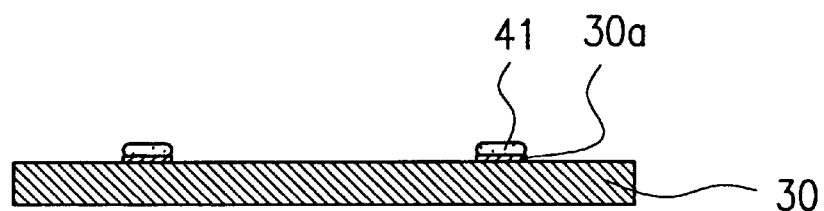
FIGS. 5A to 5D are process flows to show a method of fabricating a semiconductor package according to the present invention.

Referring to FIG. 5A, there is provided a semiconductor chip (30) having bonding pads (30A) arranged in a line adjacent to each four side. And, gold bumps (41) are formed on each bonding pad (30a). The gold bump (41) is preferably formed by Stud Bump Bonding (SSB) at a temperature of 150 to 280° C. under a pressure of 20 to 250 gf/bump and a power of 30 to 150 mW. And, the gold bump (41) has a height of 50 to 175 μm and a diameter of 50 to 100 μm. Here, the height can be controlled by the method such as tearing, pulling or coining.

Figure 5B:
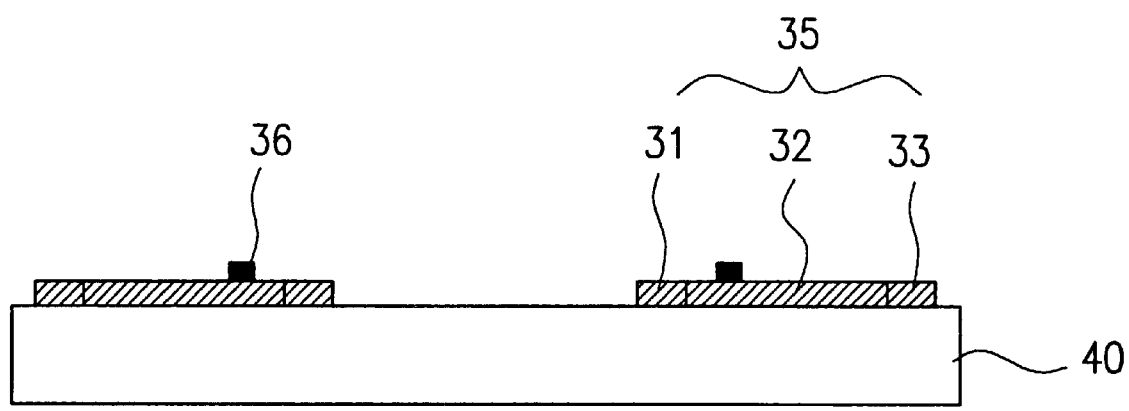

Referring to FIG. 5B, the metal patterns (35) are formed corresponding to the bonding pads (30a), and subsequently, there is provided a glass substrate having formed a Dam (36) therein. The metal pattern (35) comprises an inner pattern (31), a connecting pattern (32) and outer pattern (33) and the Dam (36) is formed in a frame-shape to surround the inner patterns (31) on the connecting pattern (32) and the glass substrate (40). The Dam is formed on the connecting pattern approximately 20 μm separated from the inner pattern (31) by screen printing or dispensing to have a height of 10 to 70 μm and a width of 30 to 100 μm.

Figure 5C:
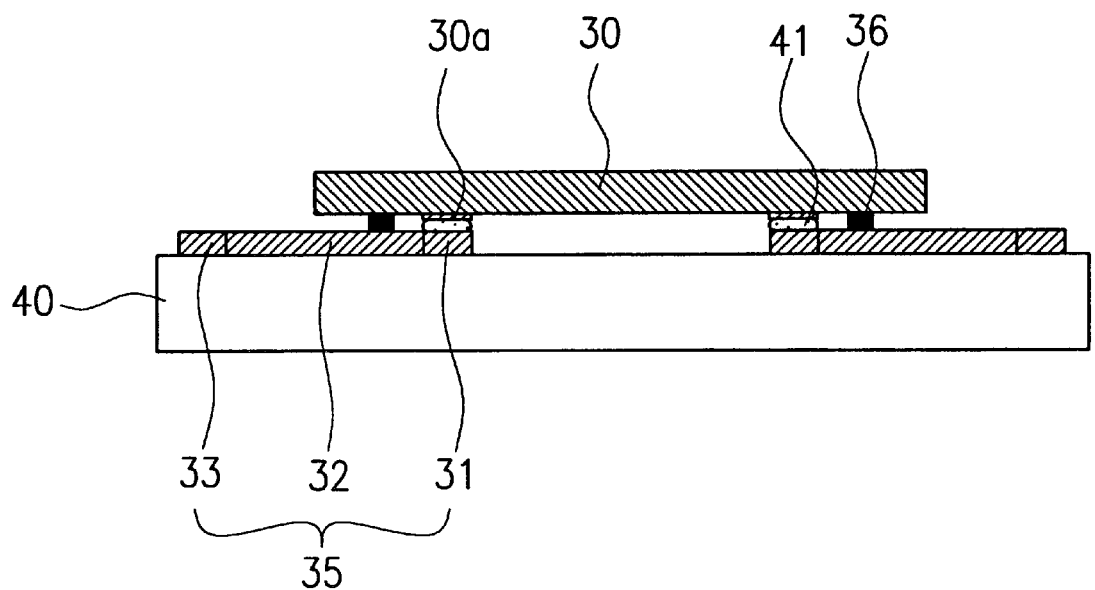

Referring to FIG. 5C, the semiconductor chips (30) are arranged on the upper portion of the glass substrate (40) so that the gold bumps (41) on the bonding pad (30a) are arranged on the upper portion of the inner pattern (31) Subsequently, the semiconductor chip (30) is bonded on the glass substrate (40) in accordance with a thermal compression process. Here, the bonding pad (30a) and the inner pattern (31) are electrically connected by the gold bump(41). The thermal compression process is conducted at a temperature of 100 to 150° C. under a pressure of 50 gf/Bump and for 2 to 5 seconds.

Figure 5D:
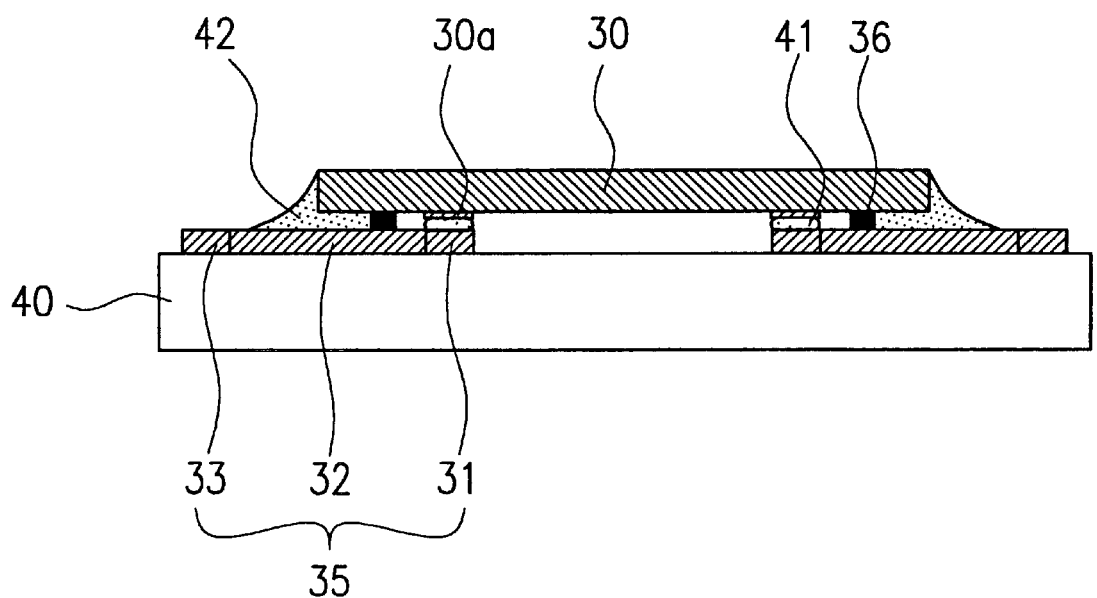

Referring to FIG. 5D, the areas around the semiconductor chip (30), that is, four sides of semiconductor chip (30) except for the outer pattern (33) are sealed to the Dam (36) with sealing material (42). The object of sealing is to have reliability of semiconductor chip (30) and the metal pattern (35). The materials curing at a temperature of 70 to 120° C. are used as a sealing material, for example, epoxy or polymer resin.

Subsequently, as shown in FIG. 3, a solder ball functioning as mounting means on the mother board is attached on the outer pattern (33) of the metal pattern (35), thereby obtaining a semiconductor package according to the present invention. The solder ball (43) has a size of about 10 to 40 mil.

As described above, a semiconductor package according to the present invention has advantages of reducing cost and improving reliability since it does not use ceramic base mold and EMC. And, a semiconductor package according to the present invention can be minimized and thinned more easily since it has a structure that the chip and substrate are electrically connected by a gold bump.

Various other modifications will be apparent to and can be readily made by those skilled in the art without departing from the scope and spirit of the present invention.

What is claimed is:

1. A semiconductor package comprising, a semiconductor chip having bonding pads respectively arranged in a line adjacent to four sides of the upper surface;

gold bumps formed on each bonding pad;

a glass substrate which is made by forming metal patterns corresponding to the bonding pads on one side, the metal patterns including an inner pattern electrically connected to the bonding pad of the semiconductor chip through the gold bump, an outer pattern separated from the inner pattern and connecting pattern between the inner pattern and the outer pattern and then forming a Dam in a frame-shape on the connecting pattern and on the one side to surround the inner patterns;

sealing material sealing the space between the glass substrate and the semiconductor chip on an outer side of the Dam except for the outer pattern of the metal pattern; and solder balls attached on the outer patterns of each metal pattern.

2. The semiconductor package according to claim 1, further comprising a color filter formed on an active area of the upper surface of the semiconductor chip.

3. The semiconductor package according to claim 1, wherein the gold bumps have a height of 50 to 175 $\mu$m, and diameter of 50 to 100 $\mu$m.

4. The semiconductor package according to claim 1, wherein the metal patterns comprise one compound selected from the group consisting of indium+tin, indium+tin+copper, indium+tin+gold, and indium+tin+copper+gold.

5. The semiconductor package according to claim 1, wherein the metal patterns have a thickness of 1 to 3 $\mu$m and a width of 50 to 70 $\mu$m.

6. The semiconductor package according to claim 1, wherein a size of the inner pattern is 50 $\mu$m×50 $\mu$m to 100 $\mu$m×100 $\mu$m, and that of the outer pattern is 75 $\mu$m×75 $\mu$m to 100 $\mu$m×100 $\mu$m.

7. The semiconductor package according to claim 1, wherein the Dam is made of epoxy or polymer resin.

8. The semiconductor package according to claim 1, wherein the Dam has a width of 30 to 100 $\mu$m and a height of 10 to 70 $\mu$m.

9. The semiconductor package according to claim 1, wherein the sealing material is made of epoxy of polymer resin.

10. The semiconductor package according to claim 1, wherein the solder balls are made of a material that has a composition ratio 60~80 to 40~20 wt % of tin to lead.

11. The semiconductor package according to claim 10, wherein the solder balls comprise at least one dopant selected form the group consisting of silver, gold, chrome, and cobalt.

12. The semiconductor package according to claim 1, wherein the solder balls have a size of 10 to 40 mil.

13. A method of fabricating a semiconductor package comprising the steps of preparing a semiconductor chip having bonding pads arranged in a line adjacent to four sides of an upper surface and a glass substrate on which metal patterns are formed, each metal pattern having an inner pattern, an outer pattern and a connecting pattern on a position corresponding to the bonding pads;

forming gold bumps on each bonding pad;

forming a Dam in a frame-shape surrounding each inner pattern on each connecting pattern and on one side of the glass substrate;

bonding the semiconductor chip and the glass substrate by using the gold bumps to electrically connect the bonding pad and each inner pattern;

sealing a space between the glass substrate and the semiconductor chip on an outer side of the Dam except for each outer pattern; and attaching solder balls on the outer pattern of each metal pattern.

14. The semiconductor package according to claim 13, further comprising: forming a color filter on an active area of the upper surface of the semiconductor chip.

15. The method of fabricating a semiconductor package according to claim 13, wherein the step of forming gold bumps comprises the step of:

forming the gold bumps at a temperature of 150 to 280° C. under a pressure of 20 to 250 gf/Bump and a power of 30 to 150 mW.

16. The method of fabricating a semiconductor package according to claim 13, wherein the step of forming the gold bumps comprises the step of:

forming the gold bumps at a height of 50 to 175 $\mu$m and a diameter of 50 to 100 $\mu$m.

17. The method of fabricating a semiconductor package according to claim 16, wherein the step of forming gold bumps comprises the step of:

controlling the height of the gold bumps by one of tearing, pulling and coining.

18. The method of fabricating a semiconductor package according to claim 13, further comprising the step of selecting one compound from the group consisting of indium+tin, indium+tin+copper, indium+tin+gold and indium+tin+copper+gold to comprise the formed metal pattern.

19. The method of fabricating a semiconductor package according to claim 13, further comprising the step of forming the formed metal patterns a thickness of 1 to 3 $\mu$m and width of 50 to 70$\mu$m.

20. The method of fabricating a semiconductor package according to claim 13, further comprising the steps of:

forming a size of the inner pattern to 50 $\mu$m×50$\mu$m to 100 $\mu$m×100 $\mu$m and forming a size of the outer pattern to 75 $\mu$m×75 $\mu$m to 100 $\mu$m×100 $\mu$m.

21. The method of fabricating a semiconductor package according to claim 13, wherein the step of forming the DAM comprises the step of making the Dam of epoxy or polymer resin.

22. The method of fabricating a semiconductor package according to claim 13, wherein the step of forming the Dam comprises the step of:

forming the Dam to have a width 30 to 100 $\mu$m and a height of 10 to 70 $\mu$m.

23. The method of fabricating a semiconductor package according to claim 13, wherein the step of forming the Dam comprises the step of:

forming the DAM by one of screen printing and dispensing.

24. The method of fabricating a semiconductor package according to claim 13, wherein the step of bonding between the semiconductor chip and the glass substrate comprises the step of:

selecting to conduct the step of bonding in accordance with thermal compression.

25. The method of fabricating a semiconductor package according to claim 24, wherein the step of bonding comprises the step of:

conducting the thermal compression at a temperature of 100 to 150° C. under a pressure of 0 to 50 gf/Bump for 2 to 5 seconds.

26. The method of fabricating a semiconductor package according to claim 13, wherein the sealing material is formed using epoxy or polymer resin.

27. The method of fabricating a semiconductor package according to claim 13, wherein the step of sealing comprises the step of:

curing a material at a temperature of 70 to 120° C.

28. The method of fabricating a semiconductor package according to claim 13, wherein the solder balls are made of a material that has a composition rate 60~80 to 40~20 wt % of tin to lead.

29. The method of fabricating a semiconductor package according to claim 28, wherein the solder balls comprise one dopant selected from the group consisting of silver, gold, chrome and cobalt.

30. The method of fabricating a semiconductor package according to claim 13, wherein the solder balls have a size of 10 to 40 mil.

* * * * *